(12) United States Patent
Osako

(10) Patent No.: US 8,917,227 B2
(45) Date of Patent: Dec. 23, 2014

(54) DISPLAY

(71) Applicant: Panasonic Corporation, Osaka (JP)

(72) Inventor: Takashi Osako, Kyoto (JP)

(73) Assignee: Panasonic Corporation, Osaka (JP)

( * ) Notice: Subject to any disclaimer, the term of this patent is extended or adjusted under 35 U.S.C. 154(b) by 71 days.

(21) Appl. No.: 13/990,503

(22) PCT Filed: Oct. 2, 2012

(86) PCT No.: PCT/JP2012/006302
§ 371 (c)(1),
(2), (4) Date: May 30, 2013

(87) PCT Pub. No.: WO2013/051236
PCT Pub. Date: Apr. 11, 2013

(65) Prior Publication Data
US 2014/0055328 A1 Feb. 27, 2014

(30) Foreign Application Priority Data
Oct. 5, 2011 (JP) .................... 2011-221186

(51) Int. Cl.
G09G 3/36 (2006.01)
H05K 1/02 (2006.01)
H05K 1/18 (2006.01)
H01L 51/50 (2006.01)

(52) U.S. Cl.
CPC ............... G09G 3/36 (2013.01); H05K 1/0203 (2013.01); H05K 1/189 (2013.01); *H01L 51/50* (2013.01); *H05K 1/0265* (2013.01); *H05K 2201/0391* (2013.01); *H05K 2201/10136* (2013.01)
USPC .......................................... 345/87; 349/151

(58) Field of Classification Search
CPC ........................ G09G 3/3648; G02F 1/13452
USPC ............................................ 345/87; 349/151
See application file for complete search history.

(56) References Cited

U.S. PATENT DOCUMENTS

| 6,597,113 | B1 | 7/2003 | Nitta |
| 7,460,112 | B2 | 12/2008 | Yamada |
| 2003/0058230 | A1 | 3/2003 | Ide |
| 2005/0007354 | A1 | 1/2005 | Yamada |
| 2008/0165483 | A1* | 7/2008 | Tanaka et al. ................. 361/681 |
| 2009/0067029 | A1 | 3/2009 | Yamada |
| 2009/0244035 | A1* | 10/2009 | Cho et al. ...................... 345/204 |
| 2013/0162622 | A1 | 6/2013 | Ebisuno et al. |

FOREIGN PATENT DOCUMENTS

| JP | 05-160527 | 6/1993 |
| JP | 06-244576 | 9/1994 |
| JP | 2000-268735 | 9/2000 |
| JP | 2000-305469 | 11/2000 |

(Continued)

OTHER PUBLICATIONS

ISR dated Dec. 25, 2012.

*Primary Examiner* — Kevin M Nguyen
(74) *Attorney, Agent, or Firm* — Greenblum & Bernstein P.L.C.

(57) ABSTRACT

A display includes: a display panel; and a flexible circuit board connected to the display panel, and including power source lines for supplying driving current to the display panel, a signal line for transmitting a control signal to the display panel, and an integrated circuit element, in which the flexible circuit board includes a metal pattern connected to the power source lines, and the metal pattern is in contact with an outer surface of the integrated circuit element directly or via a thermal conductor.

6 Claims, 14 Drawing Sheets

(56) References Cited

FOREIGN PATENT DOCUMENTS

| JP | 2003-017879 | 1/2003 |
|----|-------------|--------|
| JP | 2003-108017 | 4/2003 |
| JP | 2004-361524 | 12/2004 |
| JP | 2005-217031 | 8/2005 |
| JP | 2007-227484 | 9/2007 |
| JP | 2010-109036 | 5/2010 |

* cited by examiner

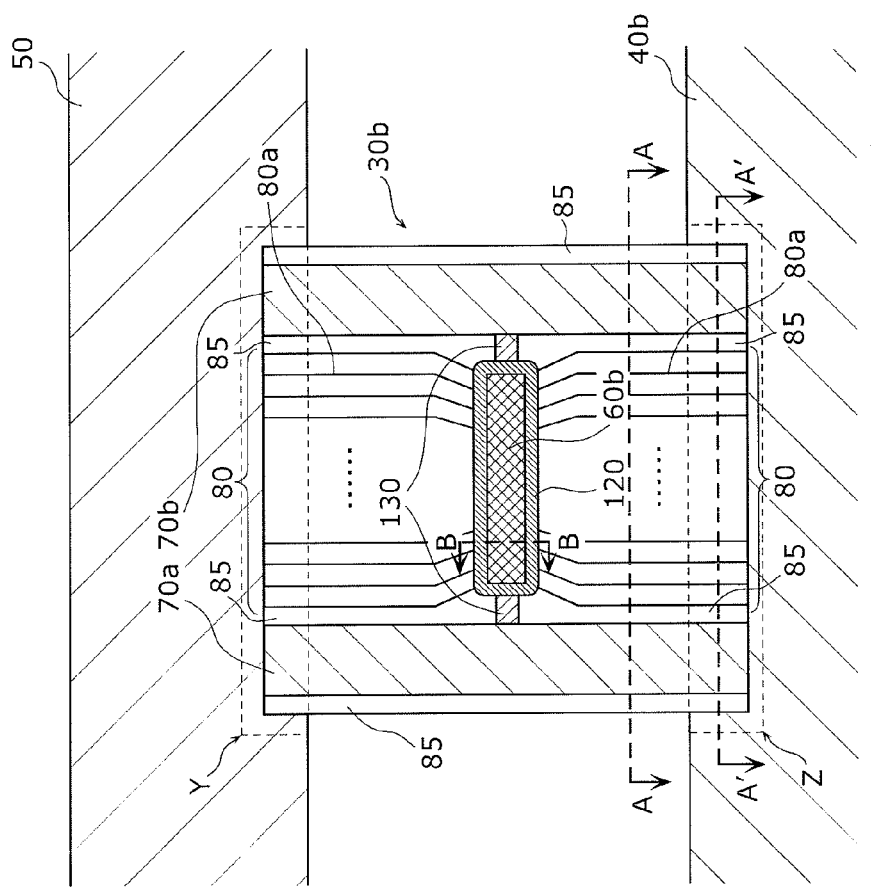

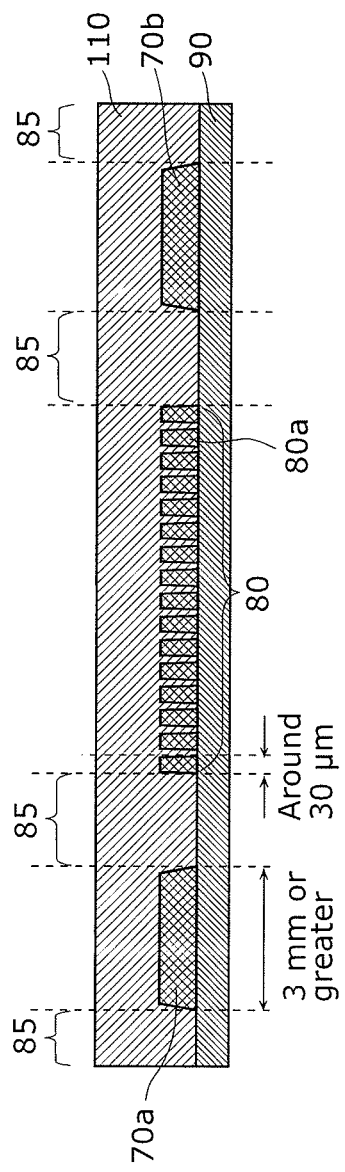

FIG. 7A (a) Max = 75.45 °C (b) Max = 73.14 °C

DISPLAY

TECHNICAL FIELD

The present invention relates generally to displays and, in particular, to a display including circuit boards including integrated circuit elements.

BACKGROUND ART

In recent years, flexible displays including bendable display panels and displays using, for example, conventional liquid crystal panels have been in active development using organic electroluminescence devices. In these flexible displays and displays using, for example, the conventional liquid crystal panels, a display panel and a driving unit are electrically connected by flexible circuit boards on which integrated circuit elements for driving the pixel circuit of the display panel are mounted.

As a heat radiation method of integrated circuit elements mounted on flexible circuit boards of such a display, Patent Literature 1 discloses a method of radiating heat by connecting, by a conductive tape, a metal chassis having a larger heat capacity in a display and power source lines of integrated circuit elements on flexible circuit boards (see Patent Literature 1).

CITATION LIST

Patent Literature

[PTL 1] Japanese Unexamined Patent Application Publication No. 2003-108017

SUMMARY OF INVENTION

Technical Problem

An object of the present invention is to provide a display that can sufficiently radiate heat from integrated circuit elements on circuit boards without using a method of adding a component such as a conductive tape.

Solution to Problem

To solve the above problem, a display according to an aspect of the present invention includes: a display panel; and a circuit board connected to a periphery of the display panel, and including a power source line for supplying driving current to the display panel, a signal line for transmitting a control signal to the display panel, and an integrated circuit element electrically connected to the signal line, in which the circuit board includes a metal pattern connected to the power source line, and the metal pattern is in contact with an outer surface of the integrated circuit element directly or via a thermal conductor.

Advantageous Effects of Invention

According to a display of the present invention, it is possible to realize a high heat-dissipation display which can sufficiently radiate heat from integrated circuit elements on circuit boards.

BRIEF DESCRIPTION OF DRAWINGS

FIG. 2A is an enlarged view of a flexible circuit board.

FIG. 2B is a cross-sectional view of a flexible circuit board (cross-sectional view taken along the line A-A in FIG. 2A).

FIG. 7A illustrates a simulation model of temperature distribution of a display according to the embodiment.

DESCRIPTION OF EMBODIMENT

Figure 1:
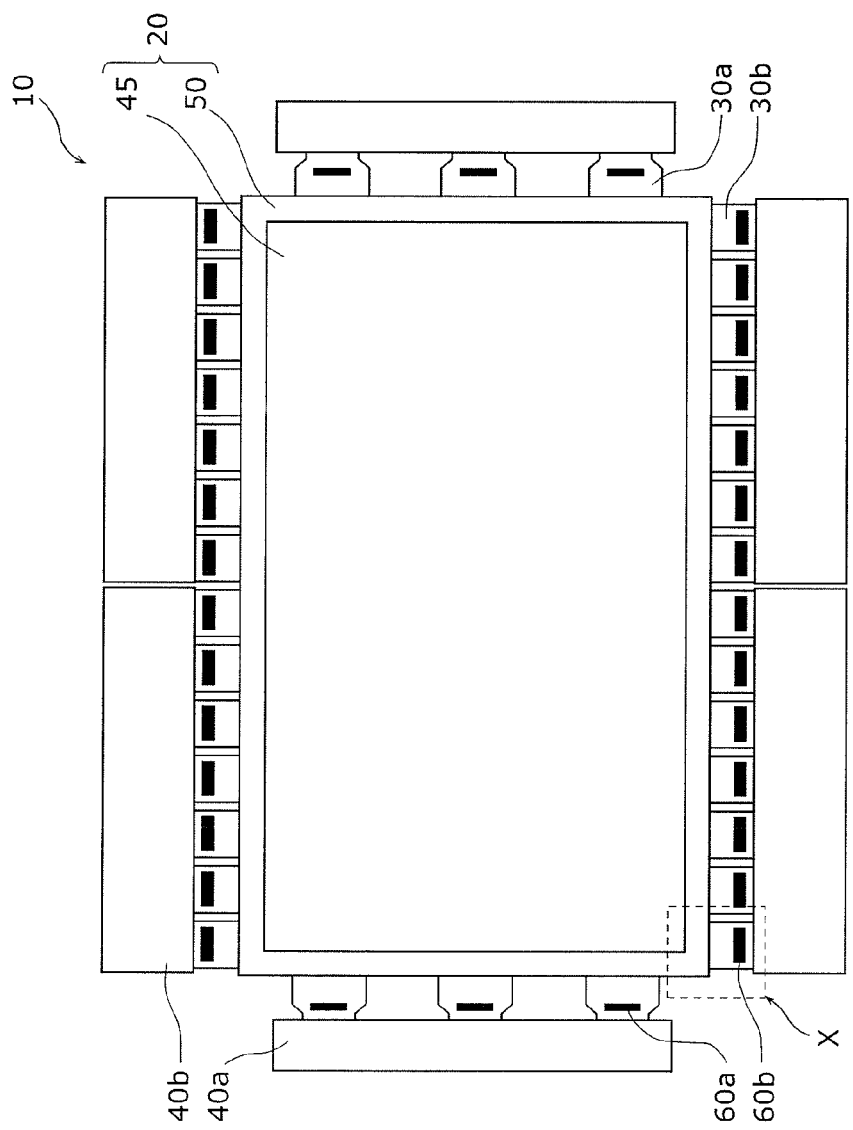
FIG. 1 illustrates a configuration of a display according to the embodiment of the present invention.

Underlying Knowledge Forming Basis of the Present Invention

As described in the Background section, Patent Literature 1 discloses a heat radiation method of integrated circuit elements mounted on flexible circuit boards of a display.

In the approach described in Patent Literature 1, an integrated circuit element is electrically connected to power source lines provided on a flexible circuit board. Moreover, the power source line has a wide portion, and by connecting the wide portion and a metal chassis by a conductive tape, heat generated in the integrated circuit element is radiated from the power source line to the metal chassis having a larger heat capacity via the conductive tape.

However, in the approach described in Patent Literature 1, a conductive tape needs to be added as a heat radiation component. This means that there is a problem that an additional component is required.

Moreover, in displays using, for example, conventional liquid crystal panels, metal components such as a metal chassis have gone out of use for cost reduction and are often replaced by resin components. In such a case, the approach of heat radiation using a metal chassis, which is recited in Patent Literature 1, may not be employed.

In particular, since a metal chassis is not used in a flexible display having a bendable display panel, the approach recited in Patent Literature 1 is not applicable and it is difficult to sufficiently radiate heat generated in integrated circuit elements mounted on flexible circuit boards.

Here, a display according to an aspect of the present invention includes a display panel and a circuit board connected to the periphery of the display panel and having a power source line for supplying driving current to the display panel, a signal line for transmitting a control signal to the display panel, an integrated circuit element electrically connected to the signal line. The circuit board includes a metal pattern connected to the power source line and the metal pattern is in contact with the outer surface of the integrated circuit element directly or via a thermal conductor.

According to this configuration, heat generated in the integrated circuit element is transmitted directly to the outer surface of the integrated circuit element or to the metal pattern in contact with the integrated circuit element via the thermal conductor, and then transmitted to the display panel having a larger heat capacity. Therefore, heat radiation effects can be sufficiently obtained. That is, it is possible to radiate heat from integrated circuit elements on circuit boards without using a method of adding, to the display, a component such as a conductive tape and a method requiring a component such as a metal chassis.

Moreover, in an aspect of the present invention, the metal pattern may be a part of the power source line and the metal pattern and the power source line may be made of the same material.

In this case, the metal pattern and the power source line are made of the same material. Therefore, the metal pattern can be formed as a part of the power source line. This means that additional components, manufacturing process, and manufacturing facilities are unnecessary to form metal patterns.

Moreover, heat generated in an integrated circuit element is directly transmitted to power source lines and to the display panel. Thus, the heat generated in the integrated circuit element is sufficiently radiated.

Moreover, in an aspect of the present invention, the thermal conductor may have a thermal conductivity higher than a thermal conductivity of the metal pattern.

Thus, the integrated circuit element and the metal pattern are brought into contact via the thermal conductor having thermal conductivity higher than that of the power source line, resulting in higher heat radiation effects.

Moreover, in an aspect of the present invention, the display panel may include: a pixel area in which pixels are arrayed in a matrix; and a line area provided to a periphery of the pixel area. In the line area, an electrode pattern in the shape of a picture frame connected to an electrode in the pixel area may be formed.

According to this configuration, the heat generated in the integrated circuit elements is transmitted to the line area which has a larger heat capacity and an electrode pattern in the shape of a picture frame. Therefore, heat dissipation can be further improved.

The following describes the embodiments of the present invention with reference to the drawings. It should be noted that each of the embodiments described below describes a preferable specific example of the present invention. Numerical values, shapes, materials, structural elements, the arrangement and connection of the structural elements, steps, the processing order of the steps and so on shown in the following embodiments are mere examples, and are not intended to limit the present invention. Among structural elements in the following embodiments, structural elements not recited in the independent claims representing superordinate concept are arbitrary structural elements.

Embodiment

FIG. 1 illustrates a configuration of a display according to the present invention.

As shown in FIG. 1, a display 10 according to the present embodiment is an active matrix display that uses an organic EL panel and includes a pixel circuit in which organic EL elements each have a thin film transistor (TFT) that is a light-emitting control element.

The display 10 includes a display panel 20, flexible circuit boards 30*a* and 30*b* connected to the display panel 20, and driving boards 40*a* and 40*b* on which driving circuits of the display panel 20 are mounted.

The display panel 20 is an organic EL panel and a thin bendable display. The display panel 20 includes a pixel area 45 in which light-emitting pixels which emit red, green, and blue (RGB) light are arrayed in a matrix, for example. The pixel area 45 includes power source lines for supplying driving current to light-emitting pixels, scanning lines that are signal lines corresponding to the rows of the light-emitting elements, and data lines that are signal lines corresponding to the columns of the light-emitting elements.

The power source lines and the signal lines (data lines and scanning lines) in the pixel area 45 extend to the periphery of the display panel 20 and form a line area 50. In the line area 50, an electrode pattern connected to electrodes in the pixel area 45 is formed. This electrode pattern is formed in the shape of a picture frame so as to surround the pixel area 45, and has a structure having a larger heat capacity and high heat radiation effects.

The line area 50 in the display panel 20 is electrically connected to the driving boards 40*a* and 40*b* corresponding to the flexible circuit boards 30*a* and 30*b*, respectively. The flexible circuit board 30*a* and the flexible circuit board 30*b* respectively include an integrated circuit element 60*a* and an integrated circuit element 60*b* which are rectangular and each have the driving function of the display panel 20.

In FIG. 1, the line areas 50 corresponding to the two short sides of the display panel 20 are respectively connected to rectangular driving boards 40*a* by the flexible circuit boards 30*a*. Specifically, three equally-spaced flexible circuit boards 30*a* connect a short side of the display panel 20 and one of the driving boards 40*a*. A terminal provided at one end of each of the flexible circuit boards 30*a* is connected to the line area 50 corresponding to a short side of the display panel 20. A terminal provided at the other end of the flexible circuit board 30*a* is connected to a terminal along a long side of the driving board 40*a*.

One integrated circuit element 60*a* is mounted on one flexible circuit board 30*a*. The integrated circuit element 60*a* is mounted on the flexible circuit board 30*a* so that the long sides are parallel to the long sides of the driving board 40*a* and the short sides of the display panel 20. The flexible circuit boards 30*a*, the driving boards 40*a*, and the integrated circuit elements 60*a* mainly drive the scanning lines of the pixel area 45 of the display panel 20 and supply driving current to the line area 50 of the display panel 20.

Moreover, the line areas 50 corresponding to the two long sides of the display panel 20 are each connected to a pair of the rectangular driving boards 40*b* by the flexible circuit boards 30*b*. Specifically, a pair of the seven equally-spaced flexible circuit boards 30*b* connects the two driving boards 40*b* to a long side of the display panel 20. A terminal provided at one end of each of the flexible circuit boards 30*b* is connected to the line area 50 corresponding to a long side of the display panel 20. A terminal provided at the other end of the flexible circuit board 30b is connected to a terminal along a long side of the driving board 40b.

One integrated circuit element 60b is mounted on one flexible circuit board 30b. The integrated circuit element 60b is mounted on the flexible circuit board 30b so that the long sides are parallel to the long sides of the driving board 40b and the long sides of the display panel 20. The flexible circuit boards 30b, the integrated circuit elements 60b, and the driving boards 40b mainly drive data lines of the pixel area 45 of the display panel 20 and supply driving current to the line area 50 of the display panel 20.

The following describes the flexible circuit boards 30b in detail.

FIG. 2A is an enlarged view of the flexible circuit board 30b.

The flexible circuit board 30b includes power source lines 70a and 70b for supplying driving current to the display panel 20, a signal line portion 80 including signal lines 80a for transmitting control signals to the display panel 20, and the integrated circuit element 60b. In the flexible circuit board 30b, a metal pattern 130 is formed on the sides at the short sides of the integrated circuit element 60b. Moreover, pattern portions 85 shown in FIG. 2A are portions which do not include lines in the flexible circuit board 30b.

The flexible circuit board 30b forms a film package such as a tape career package (TCP) and a chip on film (COF) together with the integrated circuit element 60b.

The integrated circuit element 60b is rectangular and is mounted almost in the center area on the flexible circuit board 30b so that the side of the display panel 20 to which the flexible circuit board 30b is connected and the long side of the integrated circuit element 60b are parallel to each other. This means that the integrated circuit element 60b is mounted in a center area of the flexible circuit board 30b in a direction parallel with the long sides of the display panel 20.

Terminal portions including terminals are each provided to one of the two long sides of the integrated circuit element 60b. The terminal portions and the signal lines 80a of the signal line portion 80 in the flexible circuit board 30b are electrically connected. Specifically, each terminal of the integrated circuit element 60b is bonded to one of the signal lines 80a in the flexible circuit board 30b by metal eutectic bonding. It should be noted that terminal portions are not provided to the two short sides of the integrated circuit element.

Furthermore, in the present embodiment, the integrated circuit element 60b and the flexible circuit board 30b are fixed by a reinforcing resin 120. The reinforcing resin 120 is, for example, a thermoset epoxy resin but may be a photopolymerizable resin.

The reinforcing resin 120 is applied along the periphery of the integrated circuit element 60b and serves to prevent the integrated circuit element 60b from being detached from the flexible circuit board 30b. Moreover, the reinforcing resin 120 is applied so as to flow into the terminal portions provided to the portions corresponding to the long sides of the bottom surface of the integrated circuit element 60b. This allows the reinforcing resin 120 to protect the terminal portions. Being in direct contact with the terminal portions, the reinforcing resin 120 serves as an insulator.

A metal pattern 130 is connected to the power source lines 70a and 70b and is in direct contact with the integrated circuit element 60b.

The power source lines 70a and 70b are each provided at one of the both ends of the flexible circuit board 30b in the direction parallel with the side of the display panel 20 to which the flexible circuit board 30b is connected so that the power source lines 70a and 70b sandwich the integrated circuit element 60b. The power source lines 70a and 70b each supply driving current from the driving board 40b to the line area 50 of the display panel 20, and are provided in the direction perpendicular to the side of the display panel 20 to which the flexible circuit board 30b is connected. Moreover, the line width of the power source line 70a is equivalent to that of the power source line 70b.

The signal line portions 80 are formed to sandwich the integrated circuit element 60b. Moreover, the signal line portion 80 includes signal lines 80a for transmitting control signals to the line area 50 of the display panel 20. The signal lines 80a are provided to electrically connect the integrated circuit element 60b and the line area 50 and electrically connect the integrated circuit element 60b and the driving board 40b.

It should be noted that the signal lines 80a may be provided to portions corresponding to the short sides of the bottom surface of the integrated circuit element 60b. In this case, the metal pattern 130 is formed so as not to be in contact with the signal lines 80a.

Moreover, the terminal portions of the power source lines 70a and 70b and the signal line portion 80 are formed at the top end of the flexible circuit board 30b to which a side of the panel 20 is connected (Y portion in FIG. 2A) and the bottom end to which driving board 40b is connected (Z portion in FIG. 2A). An anisotropic conductive adhesive including conducting particles is provided between the terminal portions formed at this top end and the line area 50 of the display panel 20. Thus, the flexible circuit board 30b and the line area 50 of the display panel 20 are electrically connected by pressure bonding.

Likewise, an anisotropic conductive adhesive including conducting particles is also provided between the terminal portions formed at the bottom end of the flexible circuit board 30b and the driving board 40b. Thus, the flexible circuit board 30b and the driving board 40b are electrically connected by pressure bonding. The flexible circuit boards 30b are provided between the display panel 20 and the driving boards 40b, and relay driving signals corresponding to the data lines of the pixel circuit.

The following describes the power source lines 70a and 70b and the signal line portion 80 in detail.

FIG. 2B is a cross-sectional view of the flexible circuit board 30b (cross-sectional view taken along the line A-A in FIG. 2A).

As shown in FIG. 2B, the power source lines 70a and 70b of the flexible circuit board 30b are formed on the top surface of a base 90, and the top surfaces of the power source lines 70a and 70b are covered with a cover 110.

Likewise, the signal lines 80a of the flexible circuit board 30b are formed on the top surface of the base 90, and the top surfaces of the signal lines 80a are covered with the cover 110.

Moreover, in the pattern portions 85 which do not include lines, the top surface of the base 90 is covered with the cover 110.

The base 90 is, for example, made of polyimide. The power source lines 70a and 70b and the signal lines 80a are, for example, copper lines. Moreover, the cover 110 is, for example, made of solder resist.

The signal line portion 80 includes the signal lines 80a having, for example, a line width of around 30 μm, which are lines for transmitting control signals to the display panel 20. Meanwhile, the power source lines 70a and 70b for supplying driving current to the line area 50 of the display panel 20 have a line width of 3 mm or greater, for example.

This is because the line widths of the lines are determined by taking into account the amount of voltage decreased in the lines due to current flowing in the lines. The self-emitting display panel 20 such as an organic EL panel requires large driving current. In the power source lines 70a and 70b for supplying current to the display panel 20, current is larger than current in the signal lines 80a. Therefore, the power source lines 70a and 70b have line widths greater than that of the signal line 80a. That is, the power source lines 70a and 70b have thermal capacity greater than that of the signal line 80a, and thus have higher heat dissipation effects.

Moreover, the power source lines 70a and 70b supply driving current to the line area 50 of the display panel 20, but do not supply a power source to the integrated circuit element 60b. Lines for supplying a power source to the integrated circuit element 60b are provided separately from the power source lines 70a and 70b, and are included in the signal line portion 80. Therefore, the power source lines 70a and 70b and the integrated circuit element 60b are not electrically connected.

It should be noted that the terminal portions at the top and bottom ends of the flexible circuit board 30b shown in FIG. 2A are not covered with the cover 110.

Figure 2C:
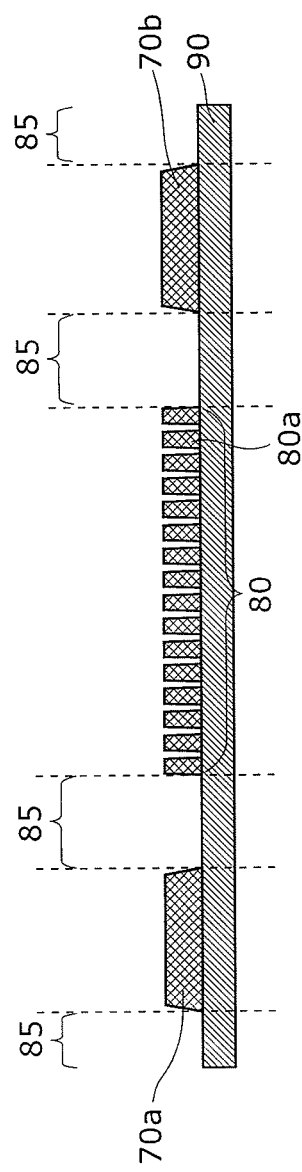
FIG. 2C is a cross-sectional view of a flexible circuit board (cross-sectional view taken along the line A'-A' in FIG. 2A).

FIG. 2C is a cross-sectional view of the flexible circuit board 30b (cross-sectional view taken along the line A'-A' in FIG. 2A).

As shown in FIG. 2C, the bottom end of the flexible circuit board 30b is not covered with the cover 110. This is because, as described above, the terminal portions at the bottom end are electrically connected to the driving board 40b by an anisotropic conductive adhesive.

Likewise, the top end of the flexible circuit board 30b is not covered with the cover 110. This is because the terminal portions at the top end are electrically connected to the line area 50 by an anisotropic conductive adhesive.

The following describes the metal pattern 130 in detail.

Figure 2D:
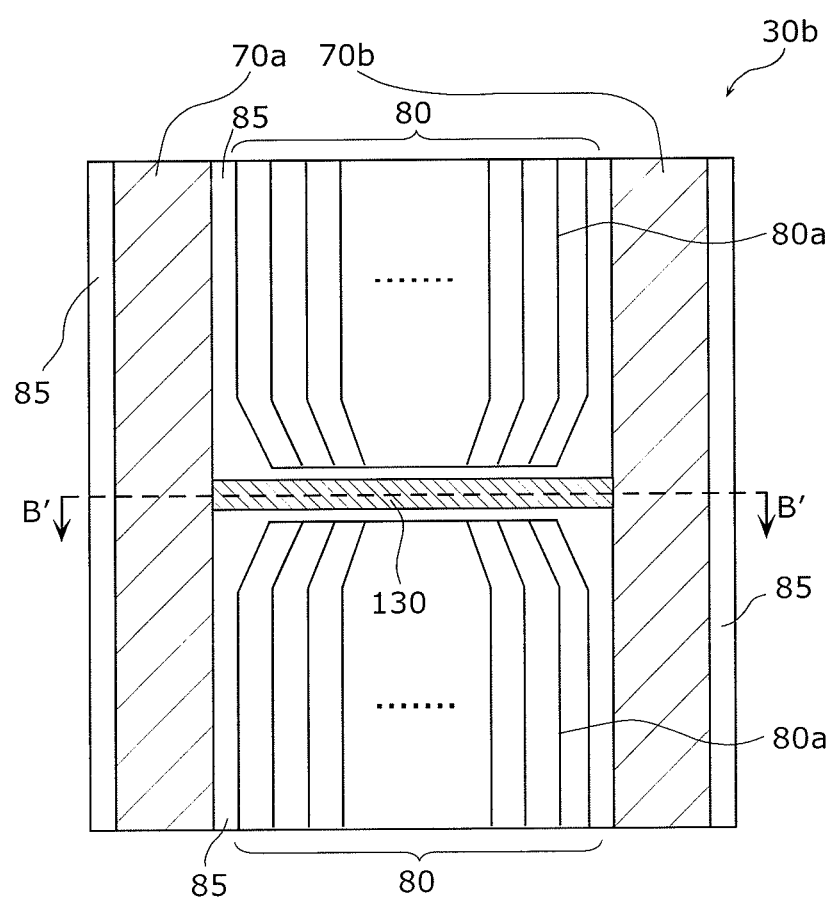
FIG. 2D is a top view of a flexible circuit board.

FIG. 2D is a top view of the flexible circuit board 30b. It should be noted that FIG. 2D illustrates the flexible circuit board 30b from which the integrated circuit element 60b and the reinforcing resin 120 are removed.

In the flexible circuit board 30b, the metal pattern 130 is formed at a portion with which integrated circuit element 60b of the flexible circuit board 30b is in contact. The metal pattern 130 is in direct contact with the outer surface of the integrated circuit element 60b, and is connected to the power source lines 70a and 70b. The metal pattern 130 is parallel to the side of the display panel 20 to which the flexible circuit board 30b is connected, and is provided in a direction perpendicular to the power source lines 70a and 70b.

Figure 2E:
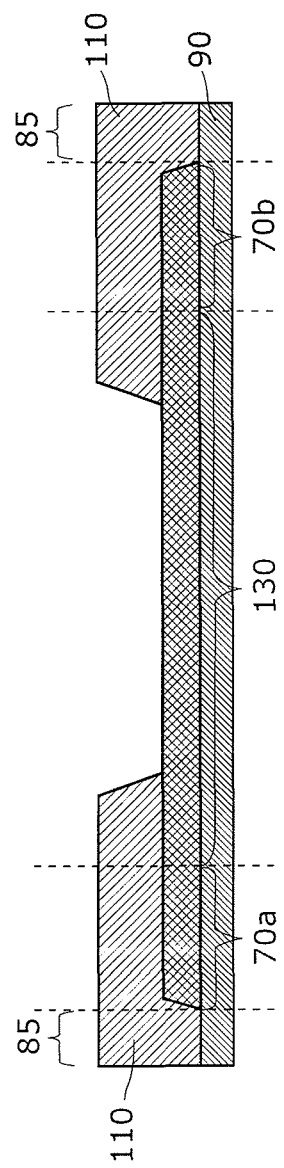
FIG. 2E is a cross-sectional view of a flexible circuit board (cross-sectional view taken along the line B'-B' in FIG. 2D).

FIG. 2E is a cross-sectional view of the flexible circuit board 30b (cross-sectional view taken along the line B'-B' in FIG. 2D).

The metal pattern 130 is made of the same material as the power source lines 70a and 70b and the signal lines 80a of the signal line portion 80. For example, the material may be copper. That is, the metal pattern 130 is formed as a part of the power source lines 70a and 70b.

Moreover, the bottom surface of the integrated circuit element 60b is in direct contact with the metal pattern 130.

Figure 3:
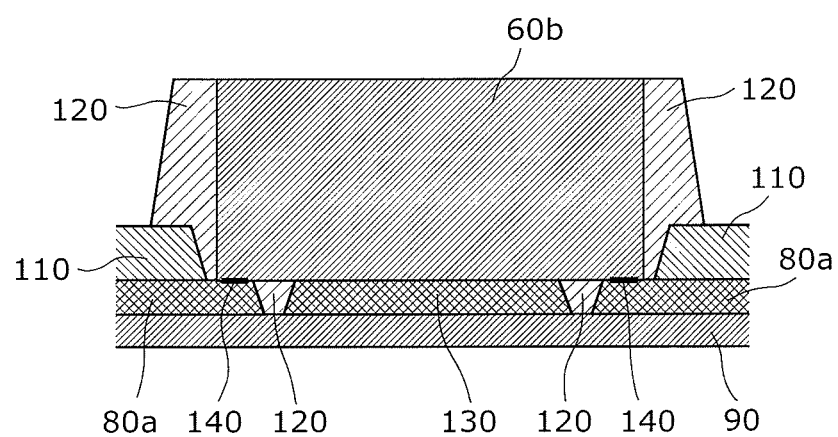
FIG. 3 is a cross-sectional view of a flexible circuit board (cross-sectional view taken along the line B-B in FIG. 2A).

FIG. 3 is a cross-sectional view of the flexible circuit board 30b (cross-sectional view taken along the line B-B in FIG. 2A).

Terminals 140 of the integrated circuit element 60b are electrically connected to the signal lines 80a included in the signal line portion 80 by metal eutectic bonding. Moreover, the reinforcing resin 120 is applied so as to surround the periphery of the integrated circuit element 60b and fixes the integrated circuit element 60b and the flexible circuit board 30b. Moreover, the reinforcing resin 120 flows into peripheral parts of the terminals 140 and serves to protect the terminals 140.

The outer surface of the integrated circuit element 60b and the metal pattern 130 are brought into contact by pressurizing. That is, the outer surface of the integrated circuit element 60b and the metal pattern 130 are in direct contact. Therefore, heat generated in the integrated circuit element 60b is transmitted to the metal pattern 130 which is a part of the power source lines 70a and 70b and is in direct contact with the outer surface of the integrated circuit element 60b. In this case, larger the contact area of the integrated circuit element 60b and the metal pattern 130 is, higher the heat dissipation effects are.

It should be noted that the metal pattern 130 is formed as part of a common manufacturing method of the flexible circuit board 30b.

Figure 4:
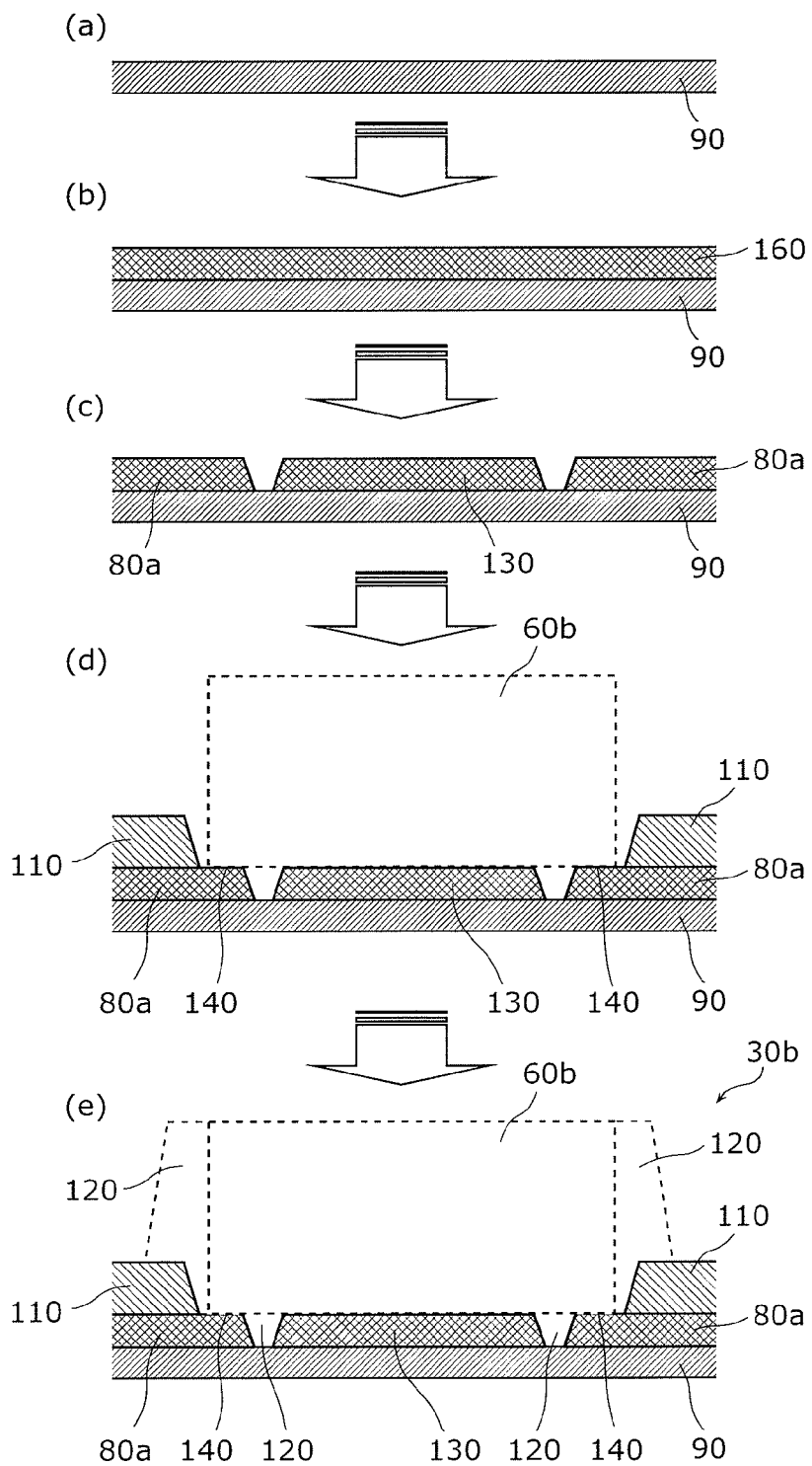
FIGS. 4(a-e) are a cross-sectional view of a flexible circuit board and illustrates a method of forming a metal pattern.

FIG. 4 is a cross-sectional view of the flexible circuit board 30b and illustrates, in particular, a method of forming the metal pattern 130 as part of the common manufacturing method of the flexible circuit board 30b.

As shown in (b) in FIG. 4, a metal layer 160 is formed on the top surface of the base 90 shown in (a) in FIG. 4. In the present embodiment, the metal layer 160 is made of copper, for example. That is, the metal layer 160 made of copper is formed on the base 90 by the metalizing process or the casting process.

As shown in (c) in FIG. 4, only the necessary portions of the metal layer 160 are left unremoved, and thus lines are patterned. Specifically, in (c) in FIG. 4, unnecessary portions of the metal layer 160 are etched, leaving the portions corresponding to the metal pattern 130 and the signal lines 80a included in the signal line portion 80 unremoved.

As shown in (d) in FIG. 4, the covers 110 are formed as necessary. It should be noted that in the flexible circuit board 30b, the cover 110 is not formed above the terminals 140 of the integrated circuit element 60b and above the metal pattern 130. After the cover 110 is formed, the integrated circuit element 60b is mounted on the flexible circuit board 30b.

As shown in (e) in FIG. 4, the reinforcing resin 120 is applied to fix the integrated circuit element 60b.

Thus, in the present embodiment, the metal pattern 130 is made of the same material as the power source lines 70a and 70b and the signal lines 80a. Therefore, the metal pattern 130 can be easily formed as a part of the power source lines 70a and 70b.

Moreover, the method of forming the metal pattern 130 described above is part of a common manufacturing method of flexible circuit boards. That is, the metal pattern 130 is formed simultaneously at the process of forming other lines such as the power source lines 70a and 70b and the signal line portion 80, for example. Therefore, additional manufacturing process or manufacturing facilities are unnecessary to form the metal pattern 130.

It should be noted that in the present embodiment, the power source lines 70a and 70b are electrically connected by the metal pattern 130.

This is because the same voltage is supplied to the power source lines 70a and 70b. When a source voltage supplied to the power source line 70a is different from a source voltage supplied to the power source line 70b, the power source lines 70a and 70b may be insulated from each other by proving an insulator 170 to the metal pattern 130 or dividing the metal pattern 130.

Figure 5A:
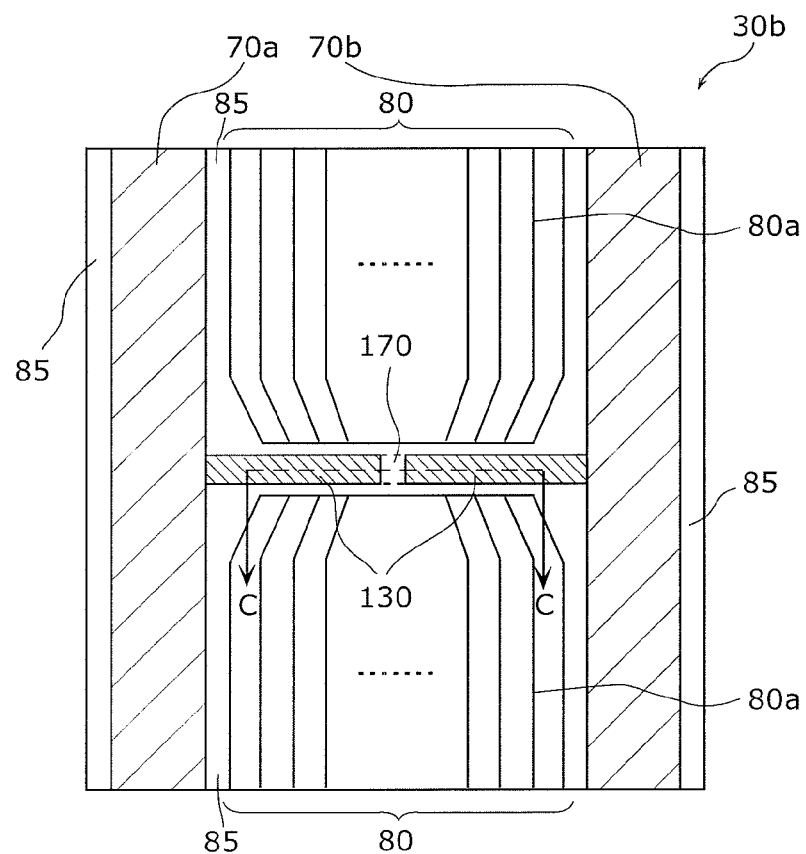
FIG. 5A is a top view of a flexible circuit board in which a metal pattern is divided.

FIG. 5A is a top view of flexible circuit board 30b in which the power source lines 70a and 70b are insulated from each other. It should be noted that FIG. 5A shows the flexible circuit board 30b from which the integrated circuit element 60b and the reinforcing resin 120 are removed.

As shown in FIG. 5A, the insulator 170 is provided in the center of the metal pattern 130 in the direction parallel with the long side of the display panel 20. In the present embodiment, the metal pattern 130 is formed as a part of the power source lines 70a and 70b as described above. Therefore, the power source lines 70a and 70b are insulated from each other by the insulator 170 provided to the metal pattern 130.

Figure 5B:
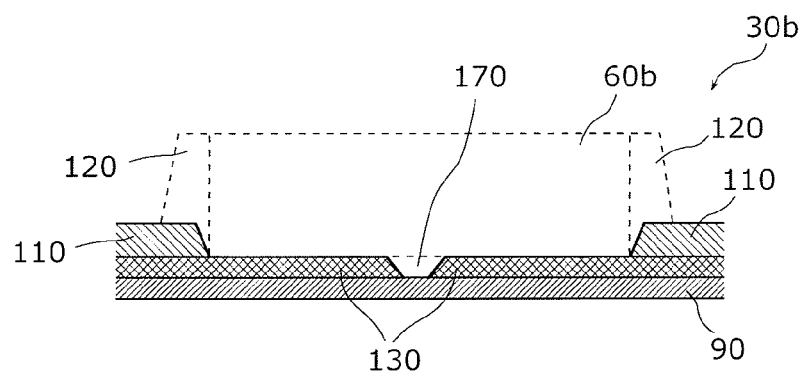
FIG. 5B is a cross-sectional view of a flexible circuit board (cross-sectional view taken along the line C-C in FIG. 5A).

FIG. 5B is a cross-sectional view of the flexible circuit board 30b (cross-sectional view taken along the line C-C in FIG. 5A).

The metal pattern 130 is formed on the top surface of the base 90 and the covers 110 are formed on the metal pattern 130. The insulator 170 is formed in the center area of the metal pattern 130 in the direction parallel with the long side of the display panel 20 by etching and removing the center area of the metal pattern 130. The insulator 170 is formed by etching, for example, in the process of patterning lines which is corresponding to the process shown in (c) in FIG. 4.

The following describes heat dissipation paths in the display 10.

Figure 6:
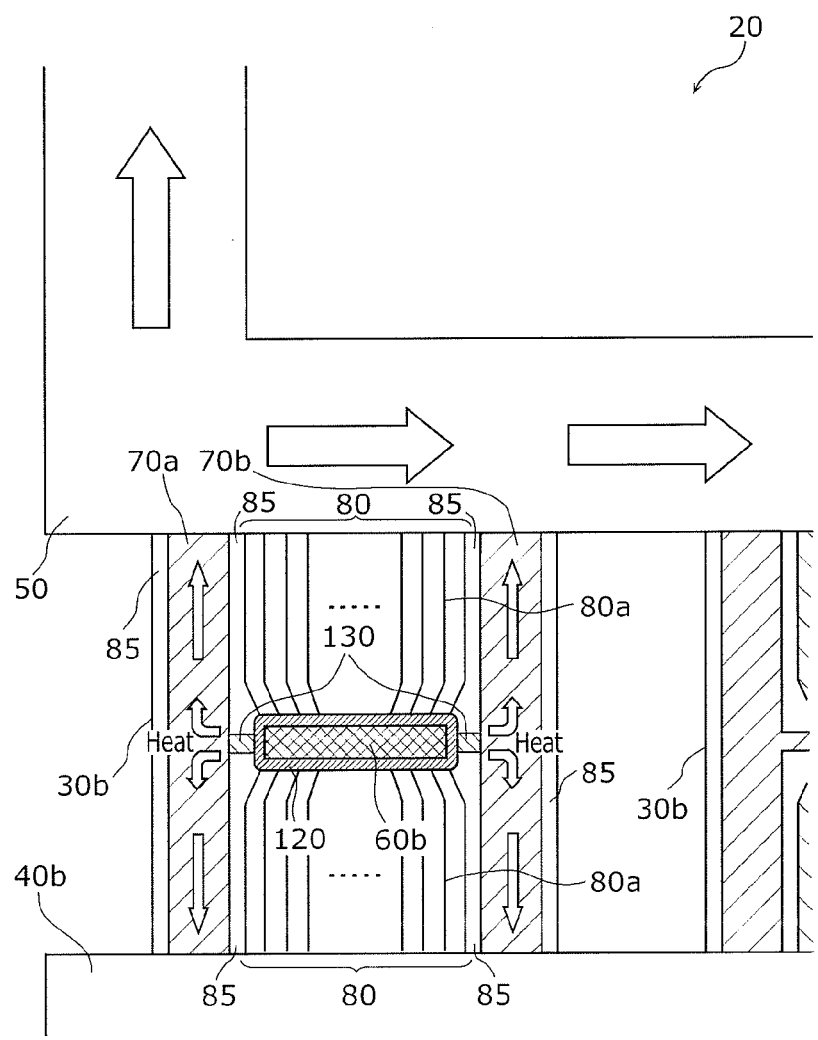
FIG. 6 is a partially enlarged view of a display (enlarged view of a portion X in FIG. 1).

FIG. 6 is a partially enlarged view of the display 10 (enlarged view of the X portion in FIG. 1).

Arrow signs in FIG. 6 indicate dissipation paths of heat generated in the integrated circuit element 60b. The heat generated in the integrated circuit element 60b is transmitted to the metal pattern 130 in direct contact with the outer surface of the integrated circuit element 60b.

The heat transmitted to the metal pattern 130 in direct contact with the outer surface of the integrated circuit element 60b is then transmitted to the power source lines 70a and 70b.

Furthermore, since the power source lines 70a and 70b are connected to the line area 50 that is the periphery of the display panel 20, heat generated in the integrated circuit element 60b is transmitted to the line area 50 of the display panel 20 which has a larger thermal capacity via the power source lines 70a and 70b. Since the line area 50 includes an electrode plate in the shape of a picture frame and has a structure of high heat dissipation effects, heat generated in the integrated circuit element 60b is sufficiently radiated.

The following describes the simulation result of temperature distribution of the display 10.

Figure 7A:
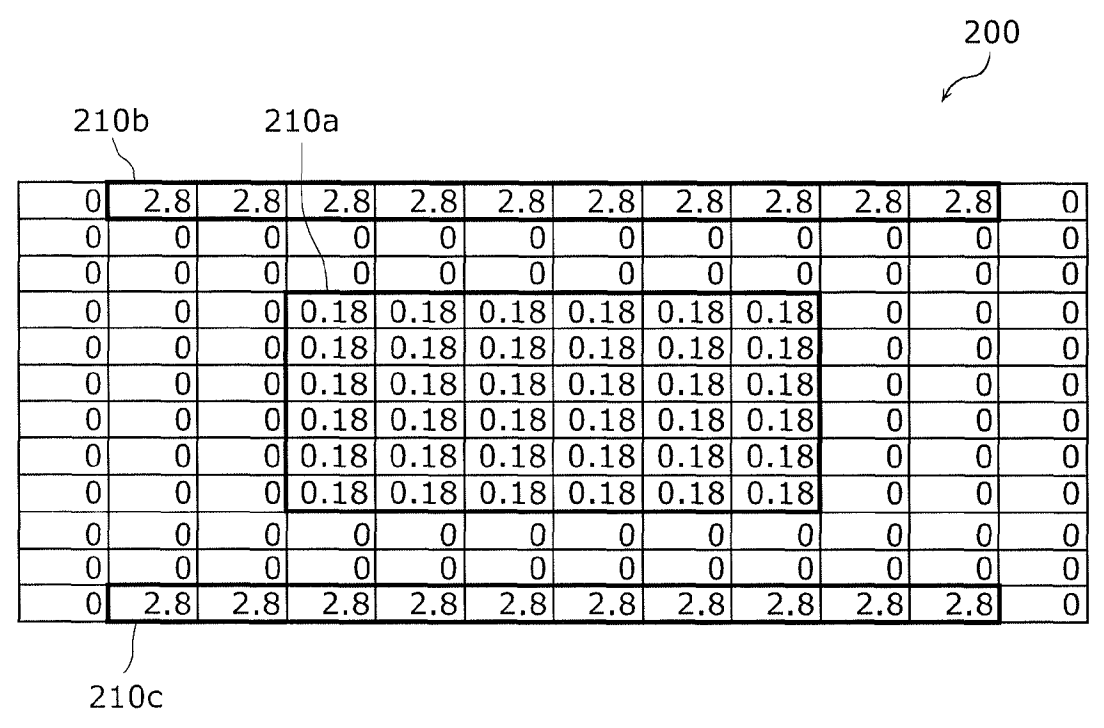

FIG. 7A illustrates a simulation model of the temperature distribution of the display 10.

As shown in FIG. 7A, a simulation was conducted for a simulation model 200 corresponding to the display panel 20 and the flexible circuit board 30b.

The center area 210a in the entire simulation model 200 corresponds to the pixel area 45. The number "0.18" in FIG. 7A represents the heat quantity of heat sources in the area 210a.

An area 210b and an area 210c shown in FIG. 7A correspond to flexible circuit boards 30b. Heat sources based on the assumed heat quantity of the integrated circuit element 60b when the pixel area 45 uniformly emits light on the above conditions are set for the areas 210b and 210c. The number "2.8" in FIG. 7A represents the heat quantity of heat sources in the areas 210b and 210c.

Moreover, parameters such as heat capacities and thermal conductivity according to the materials of the display panel 20 and the flexible circuit board 30b are set for each area laid out in a matrix in the simulation model 200.

Figure 7B:
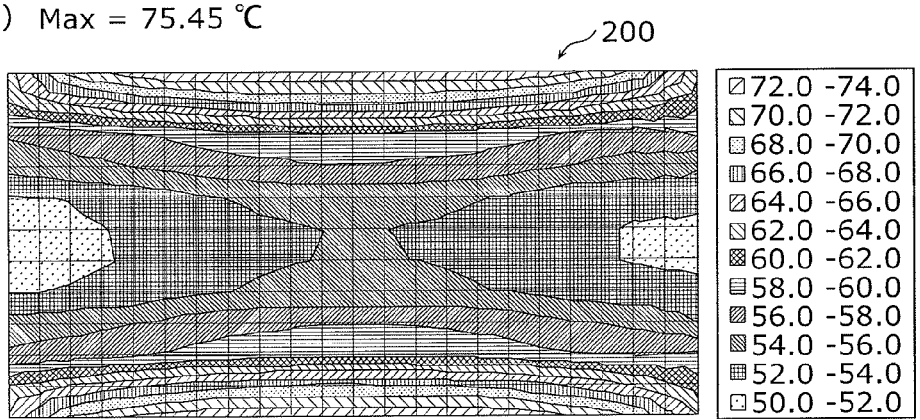
FIGS. 7B(a-b) illustrate the result of a simulation of temperature distribution of a display according to the embodiment.
Figure 7B:
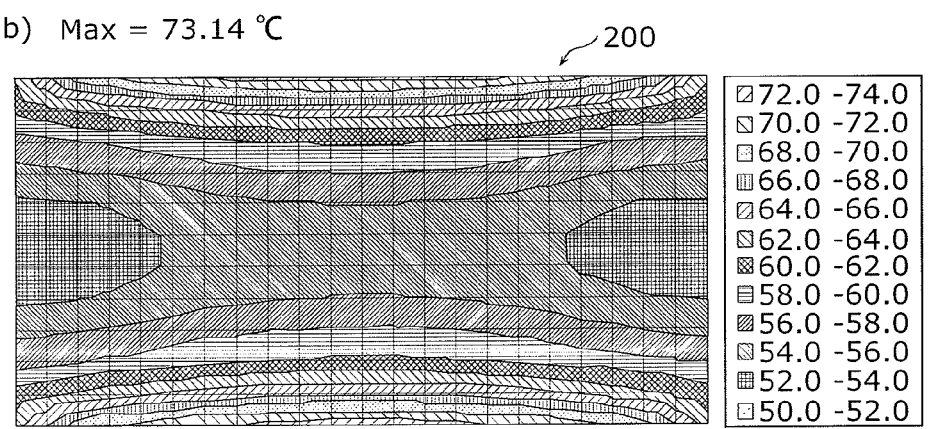

FIG. 7B illustrates a simulation result obtained by simulating the temperature distribution of the display 10 by the simulation model 200. It should be noted that the number in FIG. 7B represents temperature (unit: degrees C.).

(a) in FIG. 7B illustrates temperature distribution obtained by simulating a display when the metal pattern 130 is not formed in the flexible circuit board 30b. In the temperature distribution shown in (a) in FIG. 7B, temperature is high in the areas 210b and 210c, and the highest temperature is 75.45 degrees C.

On the other hand, (b) in FIG. 7B illustrates temperature distribution obtained by simulating the display 10 when the metal pattern 130 connected to the power source lines 70a and 70b is formed in the flexible circuit board 30b and an electrode plate in the shape of a picture frame is provided in the line area. In the temperature distribution shown in (b) in FIG. 7B, the highest temperature in the areas 210b and 210c is 73.14 degrees C., which is more than 2 degrees C. lower than the maximum temperature in (a) in FIG. 7B. This means that the display 10 has high heat dissipation.

Moreover, in (b) in FIG. 7B, heat is sufficiently radiated from the areas 210b and 210c. Therefore, the amount of change in the area 210a in the temperature distribution is smaller than that shown in (a) in FIG. 7B.

Thus, forming the metal pattern 130 as a part of the power source lines 70a and 70b can achieve the display 10 having high heat dissipation which can sufficiently radiate heat from the integrated circuit element 60b on the flexible circuit board 30b without adding a component, manufacturing process, or manufacturing facilities to form the metal pattern 130.

It should be noted that although in the present embodiment, the integrated circuit element 60b and the metal pattern 130 are in direct contact, the integrated circuit element 60b and the metal pattern 130 may be in contact via a thermal conductor.

That is, the flexible circuit board 30b may be in contact with the outer surface of the integrated circuit element 60b via the thermal conductor, and include the metal pattern 130 connected to power source lines.

Figure 8A:
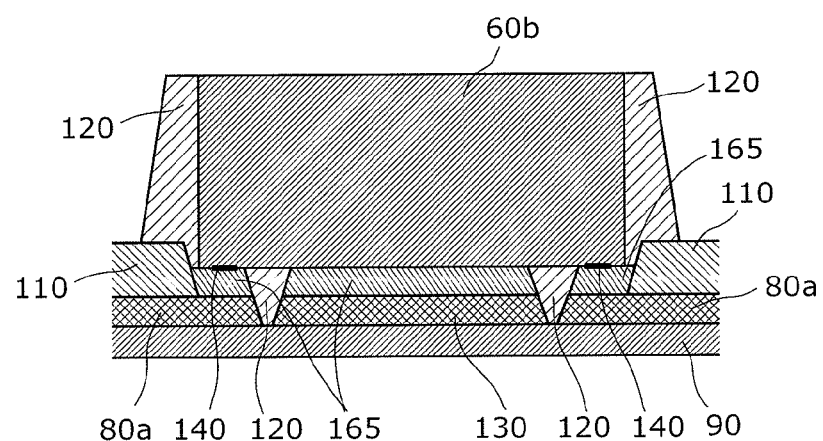
FIG. 8A is a cross-sectional view of a flexible circuit board (cross-sectional view taken along the line B-B in FIG. 2A) when a metal pattern is plated with silver as an example of a thermal conductor.

FIG. 8A is a cross-sectional view of the flexible circuit board 30b (cross-sectional view taken along the line B-B in FIG. 2A) when the metal pattern 130 is plated with silver plate 165 as an example of a thermal conductor.

The top surface of the silver plate 165 is in direct contact with the bottom surface of the integrated circuit element 60b. The undersurface of the silver plate 165 is in direct contact with the top surface of the metal pattern 130. In other words, the integrated circuit element 60b and the metal pattern 130 are in contact via the silver plate 165.

In general, the thermal conductivity of silver is 420 $W \cdot m^{-1} \cdot k^{-1}$, and the thermal conductivity of copper used for the power source lines and the metal patterns 130 in the present embodiment is 398 $W \cdot m^{-1} \cdot k^{-1}$. In other words, the silver plate 165 as a thermal conductor has thermal conductivity higher than that of the metal pattern 130 and the power source lines 70a and 70b. Therefore, when the flexible circuit board 30b and the integrated circuit element 60b are brought into contact via the silver plate 165 as the thermal conductor, effects of heat dissipation from the integrated circuit element 60b can be further improved.

It should be noted that the silver plate 165 may be formed by performing the plating process after the process in (d) in FIG. 4, for example. The plating process is often performed in the normal manufacturing process of the flexible circuit boards 30b. For example, the cover 110 is not formed on the terminal portions at the top and bottom ends of the flexible circuit board 30b. Therefore, the terminal portions are often plated to prevent rust and corrosion from forming on the terminal portions. When the plating process is performed in the manufacturing process of the flexible circuit boards 30b, the silver plate 165 and the plating of the terminal portions are formed simultaneously in the plating process.

Moreover, in the example shown in FIG. 8A, not only the metal pattern 130, but also signal lines 80a are plated with the silver plate 165, and the top surface of the signal lines 80a and the undersurface of the silver plate 165 are in contact. However, the signal lines 80a do not have to be plated with the silver plate 165.

Moreover, the thermal conductor may be a thermally conductive adhesive.

Figure 8B:
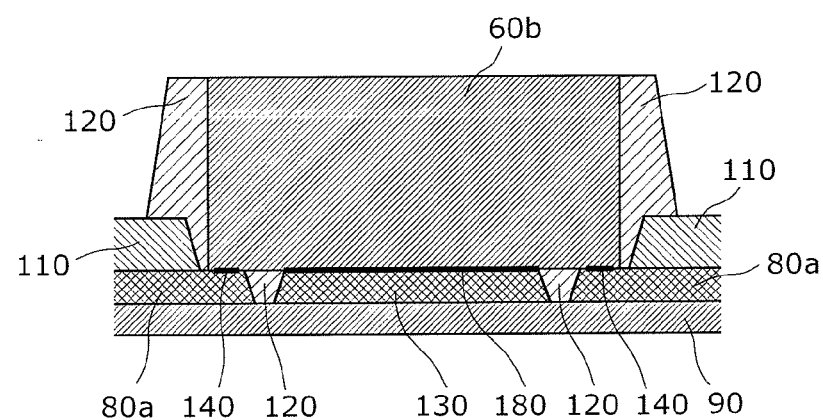
FIG. 8B is a cross-sectional view of a flexible circuit board (cross-sectional view taken along the line B-B in FIG. 2A) when an integrated circuit element and a metal pattern are in contact via a thermally conductive adhesive.

FIG. 8B is a cross-sectional view of the flexible circuit board 30b (cross-sectional view taken along the line B-B in FIG. 2A) when the integrated circuit element 60b and the metal pattern 130 are in contact via the thermally conductive adhesive.

In FIG. 8B, the bottom surface (outer surface) of the integrated circuit element 60b and the top surface of the metal pattern 130 are in direct contact with a thermally conductive adhesive 180 and bonded by the thermally conductive adhesive 180. The thermally conductive adhesive 180 is an adhesive having high thermal conductivity in which silver powders and carbon are dispersed.

Moreover, as the thermally conductive adhesive 180, a conductive paste using silver or other materials, an anisotropic conducting paste (ACP), or an anisotropic conducting film (ACF) may be used, for example.

The thermally conductive adhesive 180 is applied to the metal pattern 130 of the flexible circuit board 30b after the process in (d) in FIG. 4, for example.

Thus, when the silver plate 165, which has thermal conductivity higher than that of copper making up the metal pattern 130, the thermally conductive adhesive 180, or the like is used as a thermal conductor, and the integrated circuit element 60b and the metal pattern 130 are brought into contact via the thermal conductor, the effects of heat dissipation from the integrated circuit element 60b can be further improved.

The flexible circuit board 30b was detailed above. A similar explanation can be given to the flexible circuit boards 30a.

Moreover, in the present embodiment, the present invention is achieved in a flexible circuit board including a base made of resin or other materials. However, the present invention may be achieved in a circuit board including a base made of glass or other materials.

The present embodiment was detailed above. In the present invention, heat generated in an integrated circuit element mounted on a flexible circuit board is transmitted directly to the outer surface of the integrated circuit element or to a metal pattern in contact with the integrated circuit element via the thermal conductor. The heat is then transmitted to power source lines, and to the line area of a display having an electrode pattern and a larger heat capacity. Therefore, a display having high heat dissipation can be achieved.

Moreover, by forming the metal patterns and power source lines with the same material, the heat dissipation of the display can be improved without adding a component, manufacturing process, and manufacturing facilities to form the metal patterns.

It should be noted that the present invention is not limited to the present embodiment. Although only some exemplary embodiments of the present disclosure have been described in detail above, those skilled in the art will readily appreciate that many modifications are possible in the exemplary embodiments without materially departing from the novel teachings and advantages of the present disclosure.

Figure 9:
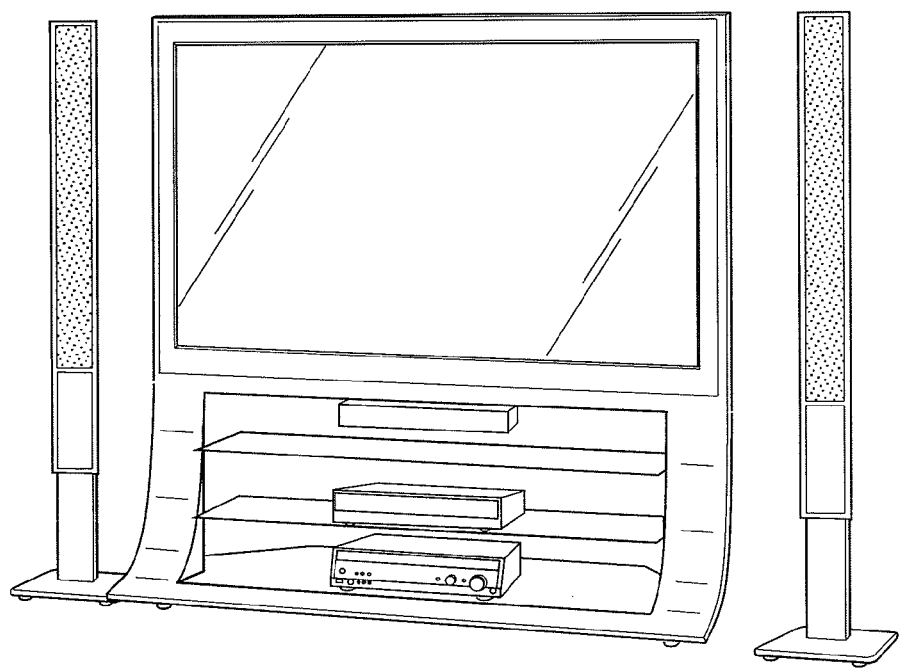
FIG. 9 is an external view of a TV set including a display according to the embodiment of the present invention. - - -.

For example, the display 10 according to the present embodiment is incorporated into a TV set as shown in FIG. 9.

It is possible to achieve a TV set having high heat dissipation which can sufficiently radiate heat from the integrated circuit elements 60a and 60b on the flexible circuit boards 30a and 30b by incorporating the display 10 according to the present embodiment into the TV set.

INDUSTRIAL APPLICABILITY

Displays according to the present invention can be used as displays including current driving light-emitting devices, and in particular, used as displays having high heat dissipation which can sufficiently radiate heat from integrated circuit elements on circuit boards, such as TV sets and computers.

REFERENCE SIGNS LIST 10 display
20 display panel
30a, 30b flexible circuit board
40a, 40b driving board
45 pixel area
50 line area
60a, 60b integrated circuit element
70a, 70b power source line
80 signal line portion
80 signal line
85 pattern portion
90 base
110 cover
120 reinforcing resin
130 metal pattern
140 terminal
160 metal layer
165 silver plate
170 insulator
180 thermally conductive adhesive
200 simulation model
210a, 210b, 210c area

The invention claimed is:

1. A display comprising:
a display panel; and
a circuit board connected to a periphery of the display panel, and including a power source line for supplying driving current to the display panel, a signal line for transmitting a control signal to the display panel, and an integrated circuit element electrically connected to the signal line,
wherein the circuit board includes a metal pattern connected to the power source line, and
the metal pattern is in contact with an outer surface of the integrated circuit element directly or via a thermal conductor.

2. The display according to claim 1,
wherein the metal pattern is a part of the power source line.

3. The display according to claim 2,
wherein the metal pattern and the power source line are made of the same material.

4. The display according to claim 1,
wherein the thermal conductor has a thermal conductivity higher than a thermal conductivity of the metal pattern.

5. The display according to claim 1,
wherein the display panel includes:
a pixel area in which pixels are arrayed in a matrix; and
a line area provided to a periphery of the pixel area,
in the line area, an electrode pattern connected to an electrode in the pixel area is formed, and
the power source line is connected to the electrode pattern.

6. The display according to claim 5,
wherein the electrode pattern is formed in a shape of a picture frame.

\* \* \* \* \*